| (12) | United States Patent | (10) Patent No.: | US 7,443,272 B2 |
|---|---|---|---|
| | Jiang et al. | (45) Date of Patent: | Oct. 28, 2008 |

(54) SIGNAL TRANSMISSION STRUCTURE, CIRCUIT BOARD AND CONNECTOR ASSEMBLY STRUCTURE

(75) Inventors: Shin-Shing Jiang, Hsin-Tien (TW); Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 210 days.

(21) Appl. No.: 11/301,382

(22) Filed: Dec. 12, 2005

(65) Prior Publication Data

US 2006/0255877 A1 Nov. 16, 2006

(30) Foreign Application Priority Data

May 10, 2005 (TW) .............................. 94115007 A (51) Int. Cl.
 *H03H 7/38* (2006.01)
 *H01P 1/04* (2006.01)
(52) U.S. Cl. ........................................ 333/260; 333/33
(58) Field of Classification Search ................ 333/33, 333/34, 260, 246
 See application file for complete search history.

(56) References Cited

U.S. PATENT DOCUMENTS

| 4,593,243 | A | * | 6/1986 | Lao et al. ..................... 324/754 |
| 2003/0206084 | A1 | * | 11/2003 | Tamaki et al. ............... 333/260 |
| 2006/0284699 | A1 | * | 12/2006 | Weiske ........................ 333/33 |

* cited by examiner

*Primary Examiner*—Stephen E Jones
(74) *Attorney, Agent, or Firm*—J.C. Patents (57) ABSTRACT

A signal transmission structure is at the edge of a circuit board, and the circuit board is connected with a coaxial cable connector through the signal transmission structure. The coaxial cable connector has a signal pin and a plurality of supporting pins for clipping the circuit board. The signal transmission structure includes a reference plane and a conductive layer. The reference plane with a non-conductive area is inside the circuit board. The conductive layer is disposed on the surface of the circuit board and above one side of the reference plane. The conductive layer includes a signal pad and a signal line. The signal line is connected with the signal pad, and the signal pad is further connected with the signal pin of the coaxial connector. The projections of the signal pad and the portion of the signal line on the reference plane are in the non-conductive area.

14 Claims, 8 Drawing Sheets

SIGNAL TRANSMISSION STRUCTURE, CIRCUIT BOARD AND CONNECTOR ASSEMBLY STRUCTURE

CROSS-REFERENCE TO RELATED APPLICATION

This application claims the priority benefit of Taiwan application serial no. 94115007, filed on May 10, 2005. All disclosure of the Taiwan application is incorporated herein by reference.

BACKGROUND OF THE INVENTION

1. Field of the Invention

The present invention relates to a signal transmission structure, circuit board and connector assembly structure, and more specifically, to a signal transmission structure, circuit board and connector assembly structure, which can increase the impedance consistency of the signal transmission path.

2. Description of the Related Art

On the large-scale printed circuit board and packaging substrate, the signal lines used for the electrical connections between two components or two terminals are generally kept a consistent width or an approximate width, so that the characteristic impedance of the signal lines can remain the same. Especially for the signal transmission of high-speed and high-frequency signals, a better impedance match between two terminals is further required for the circuit designers because the un-matched impedance between the terminals will case the signal reflection and reduce the quality of signal transmission. More particularly, the insertion loss of the signal transmission should be reduced, and the return loss of the signal transmission should be relatively increased, so that the signal transmission quality could be maintained.

Figure 1:
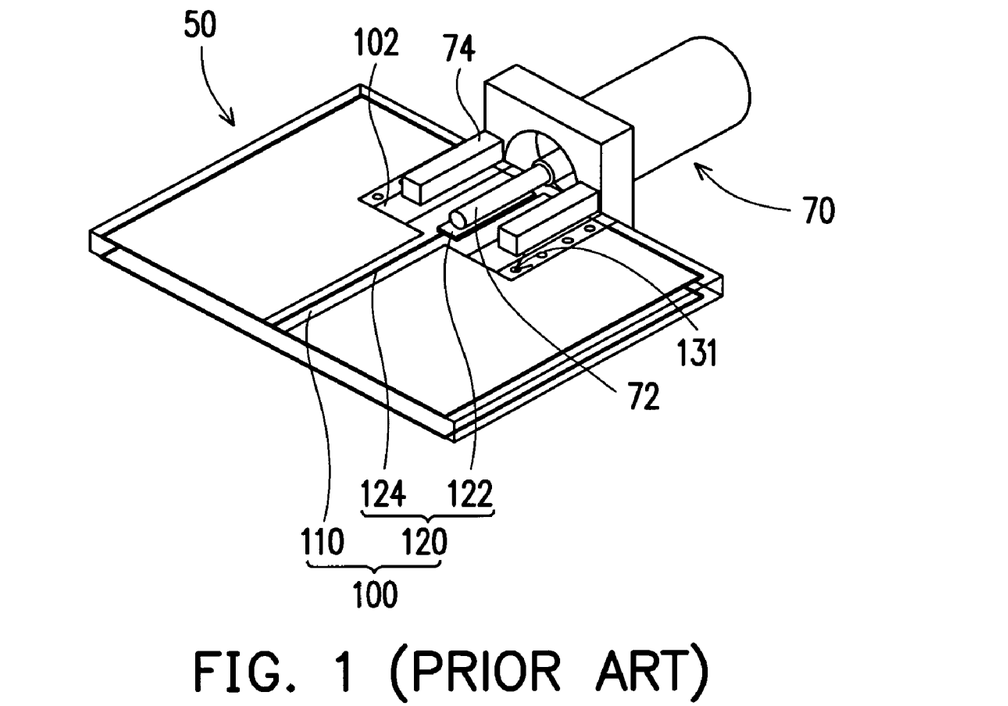
FIG. 1 illustrates a connection diagram of a conventional circuit board and an edge-feed SMA connector.
Figure 2:
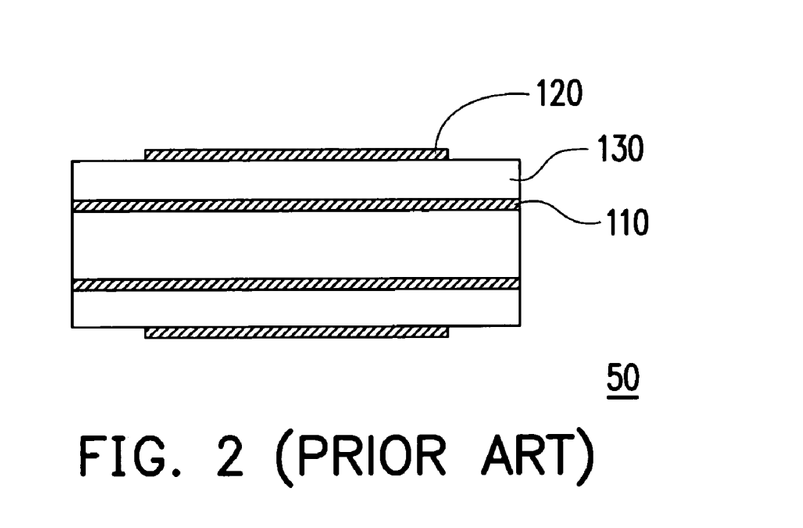
FIG. 2 is a partial cross-sectional view of the circuit board in FIG. 1.
Figure 3A:
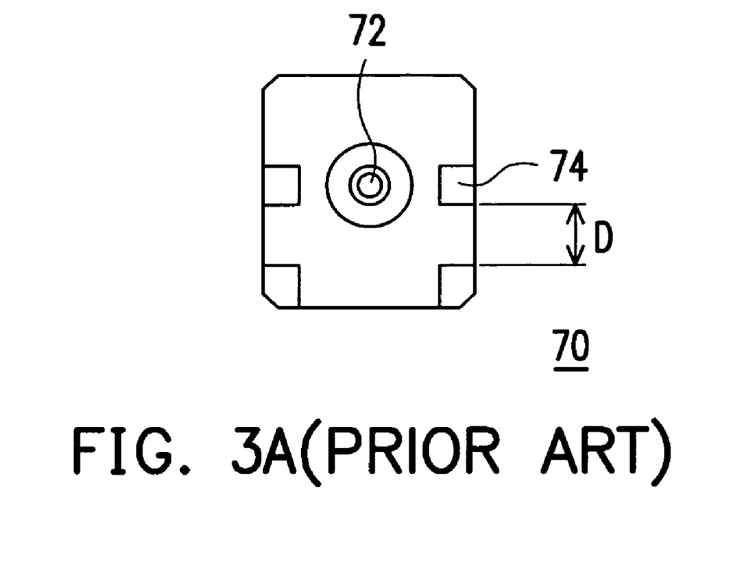
FIG. 3A and FIG. 3B are side views of different angles of the SMA connector in FIG. 1.
Figure 3B:
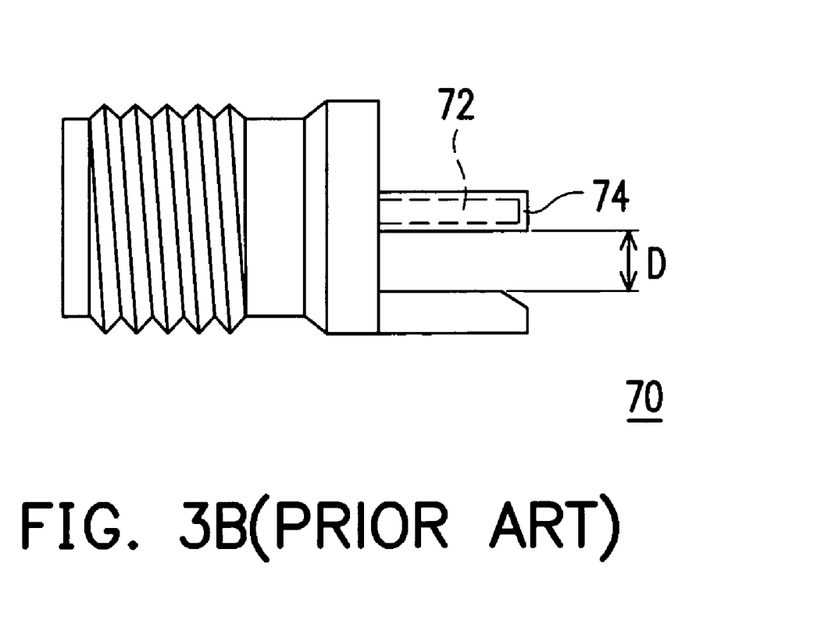
Figure 4A:
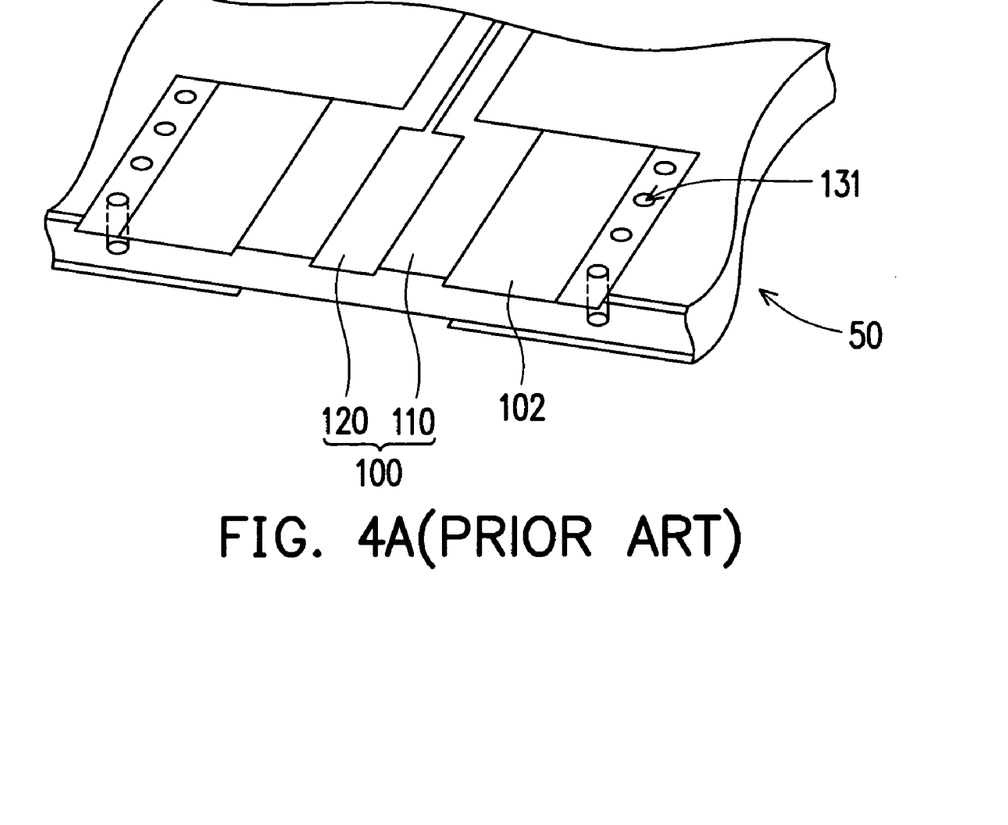
FIG. 4A is a partial 3-dimensional view of the circuit board in FIG. 1.
Figure 4B:
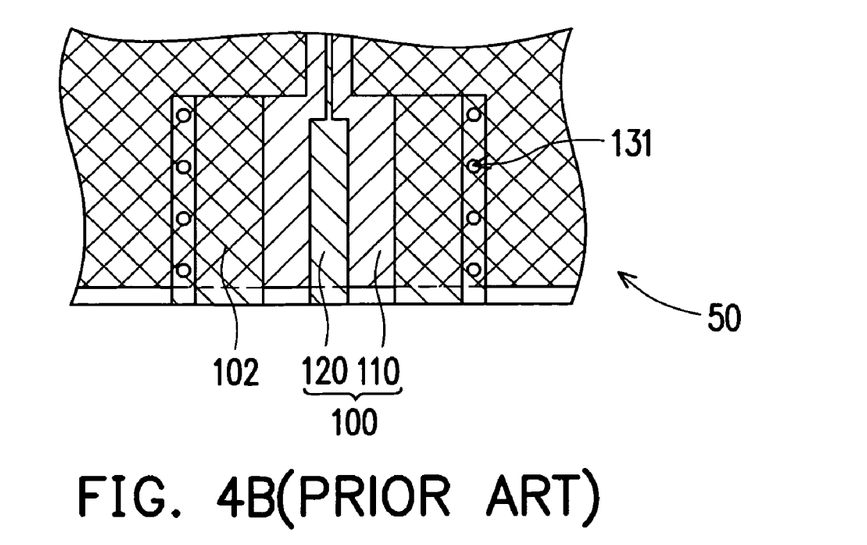
FIG. 4B is the top view of the circuit board in FIG. 4A.

FIG. 1 illustrates a connection diagram of a conventional circuit board and an edge-feed SMA connector. FIG. 2 is a partial cross-sectional view of the circuit board in FIG. 1. FIG. 3A and FIG. 3B are side views of the SMA connector in FIG. 1 from the different viewpoints. FIG. 4A is a partial 3-dimensional view of the circuit board in FIG. 1, while FIG. 4B is the top view of the circuit board in FIG. 4A. With reference to FIG. 1, FIG. 2, FIG. 3A, FIG. 3B, FIG. 4A and FIG. 4B, FIG. 4A, there are only illustrated the conductive portion of the circuit board, while the insulation portion of the circuit board is omitted. The conventional signal transmission structure 100 is located at the edge of a circuit board 50, and the circuit board 50 is a 4-layer circuit board which is suitable for connection with an edge-feed SMA connector 70 through the signal transmission structure 100. The SMA connector 70 is a coaxial connector having a signal pin 72 and a plurality of supporting pins 74, and the supporting pins 74 are suitable for the mechanical connections between the circuit bard 50 and the SMA connector 70, like the supporting pins 74 are clipped the circuit board 50 for example. More specifically, the signal transmission structure 100 has a plurality of supporting pads 102, and the supporting pads 102 are electrically connected to a reference plane (e.g. a power plane or a ground plane) of the circuit board 50, for example through a plurality of through holes 131. The supporting pins 74 are connected with the supporting pads 102, and the supporting pins 74 clip the circuit board 50, so that the above SMA connector 70 is fixed on the circuit board 50, and is electrically connected to the reference plane of circuit board 50. In addition, the distance D between the supporting pins 74 shown in FIG. 3A is greater than or equal to the thickness of the circuit board 50 shown in FIG. 1, so that the supporting pins 74 can firmly clip the circuit board 50 after the supporting pins 74 are soldered on the corresponding supporting pads 102.

The circuit board 50 has four conductive layers, including the reference plane 110 inside the circuit board 50 and the conductive layer 120 on the surface of the circuit board 50. The conventional signal transmission structure 100 at least includes the reference plane 110 and the conductive layer 120. The reference plane 110 includes another portion of or whole conductive layer overlapping the conductive layer 120. In other words, the conductive layer 120 is disposed above one side of the reference plane 110. A dielectric layer 130 is further disposed between the reference plane 110 and the conductive layer 120 to insulate the reference plane 110 and the conductive layer 120 structurally and electrically. In addition, the conductive layer 120 includes a signal pad 122 and a signal line 124. The signal line 124 is connected with the signal pad 122, and the signal pad 122 is suitable for connecting with the signal pin 72 of the SMA connector 70 to transmit signals via the signal pad 122.

In the above signal transmission structure 100, the characteristic impedance value of the signal pad 122 is less than the characteristic impedance value of the signal line 124. The thinner dielectric layer 130, the more difference between the characteristic impedance values of signal pad 122 and the signal line 124. In other words, the impedance consistency of the signal pad 122 and the signal line 124 is not satisfactory, which causes increased insertion loss in signal transmission, thus adversely affecting the signal transmission quality.

SUMMARY OF THE INVENTION

One example of the present invention provides a signal transmission structure suitable for a circuit board. The signal transmission structure is located at the edge of the circuit board. The circuit board is suitable to connect a coaxial connector through the signal transmission structure. The coaxial connector has a signal pin and a plurality of supporting pins which are suitable for the mechanical connections with the circuit board. The signal transmission structure includes a reference plane and a conductive layer. The reference plane is inside the circuit board, and has a first non-conductive area, while the conductive layer is located above one side of the reference plane, and on the surface of the circuit board. The conductive layer includes a signal pad and a signal line. The projection of the signal pad on the reference plane is located in the first non-conductive area and the signal pad is suitable to be connected with the signal pin. The signal line is connected with the signal pad, and the projection of a portion of the signal line on the reference plane is in the first non-conductive area.

Another example of the present invention further provides a signal transmission structure suitable for a circuit board. The signal transmission structure is located at the edge of the circuit board. The circuit board is suitable to connect a coaxial connector through the signal transmission structure. The coaxial connector has a signal pin and a plurality of supporting pins which are suitable to clip the circuit board. The signal transmission structure includes a reference plane and a conductive layer. The reference plane is inside the circuit board, and has a first non-conductive area and a second non-conductive area, wherein the first non-conductive area is adjacent to the second non-conductive area. The conductive layer is disposed above one side of the reference plane. The conductive layer includes a signal pad and a signal line. The projection of the signal pad on the reference plane is in the first non-conductive area, and the signal pad suits for connecting with the signal pin. The signal line is connected with the signal pad, and the projection of a portion of the signal line on the reference plane is in the second non-conductive area.

Another example of the present invention further provides a circuit board which is suitable for connecting to a coaxial connector through the board edge, wherein the coaxial connector has a signal pin and a plurality of supporting pins, and the supporting pins are suitable for the mechanical connections with the circuit board. The circuit board includes a reference plane, a conductive layer and a dielectric layer, and the dielectric layer is disposed between the conductive layer and the reference plane, and the reference plane has a first non-conductive area. In addition, the conductive layer includes a signal pad and a signal line, and the projection of the signal pad on the reference plane is in the first non-conductive area. The signal line is connected to the signal pad, and the projection of a portion of the signal line on the reference plane is in the first non-conductive area.

The embodiments, features, aspects, and advantages of the present invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAIL DESCRIPTION OF THE EMBODIMENTS

First Embodiment

Figure 5A:
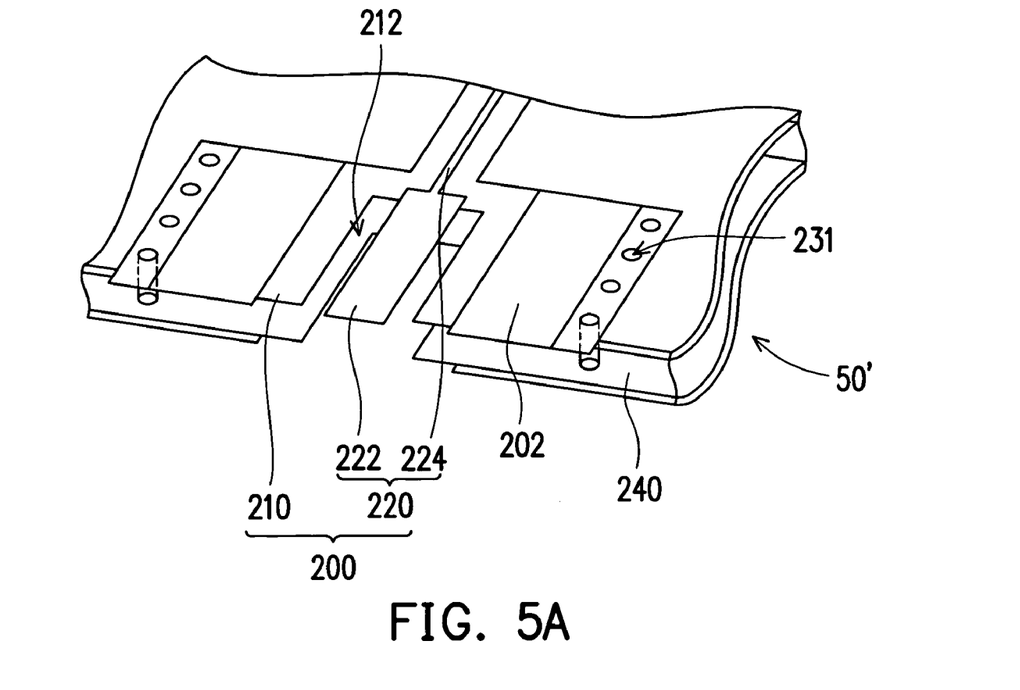
FIG. 5A illustrates a 3-dimensional diagram of the signal transmission structure of the first embodiment of the present invention.
Figure 5B:
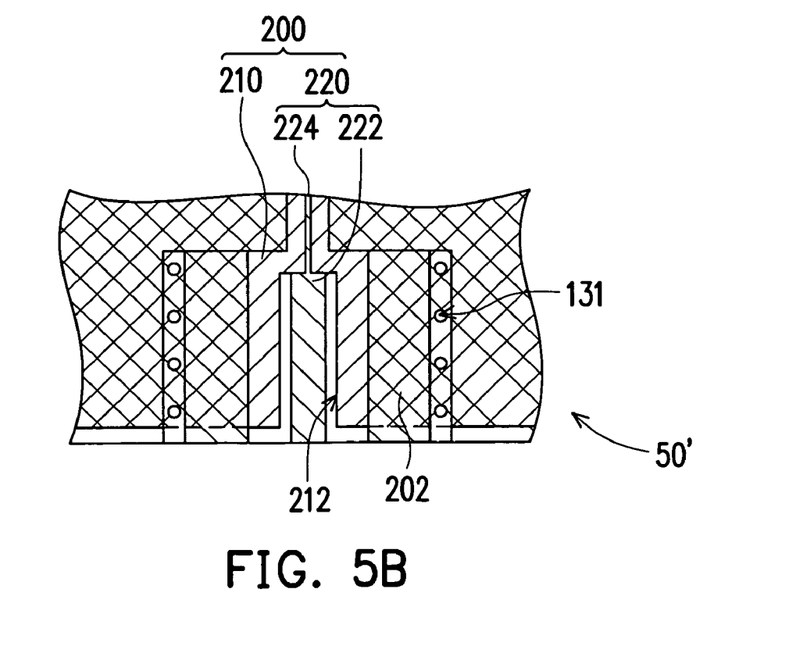
FIG. 5B is a top view of the signal transmission structure in FIG. 5A.
Figure 5C:
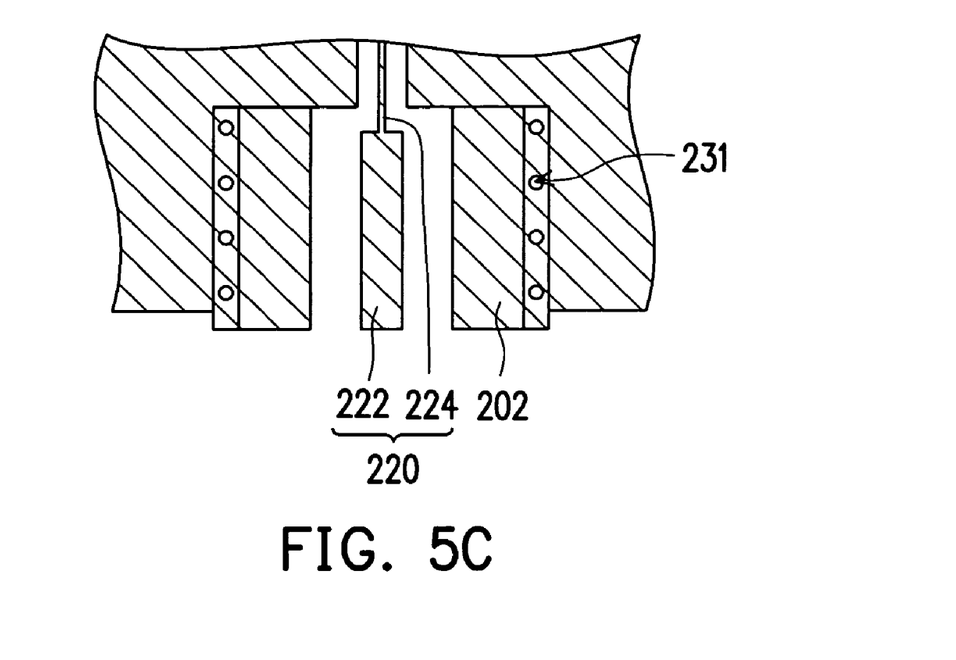
FIG. 5C and FIG. 5D are respectively top views of the conductive layer and the reference plane in FIG. 5B.
Figure 5D:
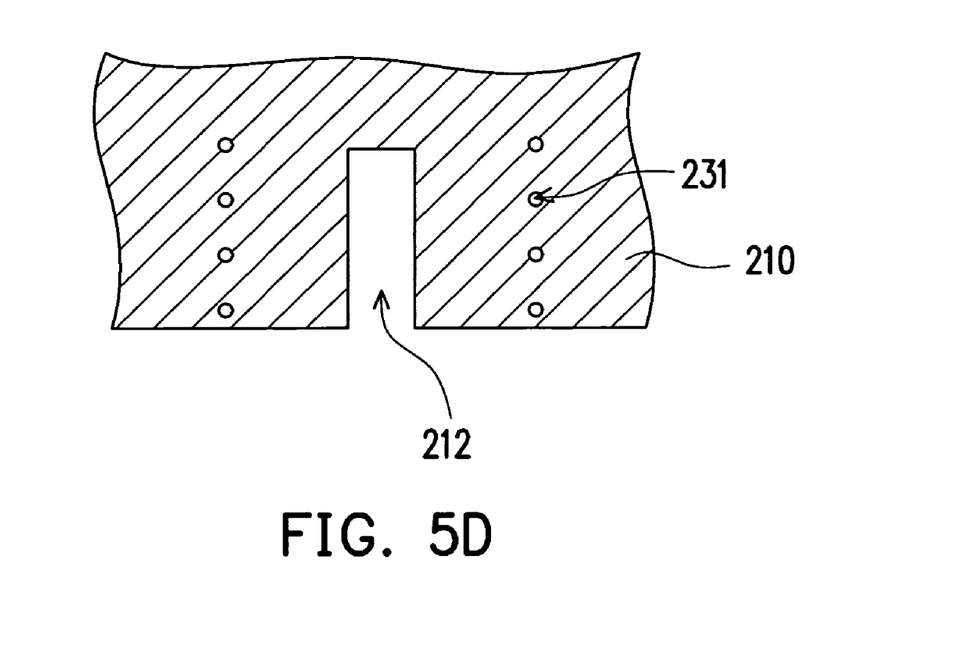
Figure 5E:
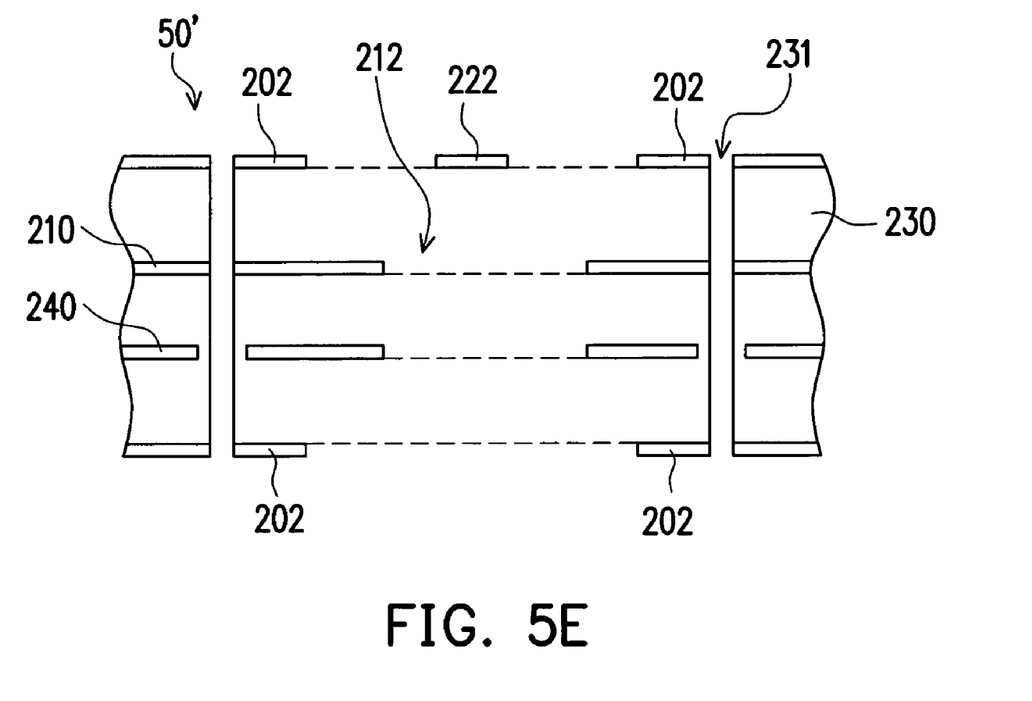
FIG. 5E is a cross-sectional view of the signal transmission structure in FIG. 5A.

FIG. 5A illustrates a 3-dimensional diagram of the signal transmission structure of the first embodiment of the present invention. FIG. 5B is a top view of the signal transmission structure in FIG. 5A. FIG. 5C and FIG. 5D are top views of the conductive layer and the reference plane in FIG. 5B. FIG. 5E is a cross-sectional view of the signal transmission structure in FIG. 5A. With reference to FIG. 5A to FIG. 5E, FIG. 5A only illustrates the conductive portion, while the dielectric portion is omitted. A signal transmission structure 200 of the first embodiment of the present invention is suitable for a circuit board 50', and located at the edge of circuit board 50'. The circuit board 50' is suitable for connecting to an edge-feed coaxial connector through the signal transmission structure 200, wherein the coaxial connector is a SMA connector 70 (as shown in FIG. 1, FIG. 3A and FIG. 3B) for example, which has a signal pin 72 and a plurality of supporting pins 74, and the supporting pins 74 are suitable for the mechanical connections with the circuit board 50'. In addition, the signal transmission structure 200 includes a reference plane 210 and a conductive layer 220, and the reference plane 210 and the conductive layer 220 are two of the components of the circuit board 50'. The reference plane 210 is consisted of a portion of a conductive layer or is consisted of whole of a conductive layer, which is overlapping the conductive layer 220. The reference plane 210 is inside the circuit board 50', and has a first non-conductive area 212; while the conductive layer 220 is disposed above one side of the reference plane 210, and located on the surface of the circuit board 50'. In addition, the conductive layer 220 includes a signal pad 222 and a signal line 224. The signal line 224 is connected with the signal pad 222, and the projection of the signal pad 222 on the reference plane 210 is located in the first non-conductive area 212. The signal pad 222 is suitable for connecting with the signal pin 82 to transmit signals via the signal pad 222.

The signal pin 72 of the SMA connector 70 as shown in FIG. 1 is connected to the signal pad 222 of the signal transmission structure 200 through the soldering process for example. The signal transmission structure 200 further has a plurality of supporting pads 202 disposed between the supporting pins 74 of SMA connector 70 and the circuit board 50' respectively; and the supporting pins 74 clip the circuit board 50', so that the SMA connector 70 is fixed on the circuit board 50', and is electrically connected to the reference plane (e.g. a power plane or a ground plane) of the circuit board 50'. The above supporting pad 202 may be electrically connected to the reference plane 210 through at least a conductive via 231 such as a through via or a micro via.

The signal transmission structure 200 of the present embodiment may further includes a dielectric layer 230 disposed between the conductive layer 220 and the reference plane 210, to insulate the conductive layer 220 and the reference plane 210 structurally and electrically. The reference plane 210 can be a ground plane or a power plane. Note that the signal transmission structure 200 of the present embodiment can further include another conductive layer and/or a reference plane, such as a reference plane 240 in FIG. 5A and FIG. 5E.

In the present embodiment, since the projection of the signal pad 222 of the conductive layer 220 on the reference plane 210 is in the first non-conductive area 212, the capacitance induced between the signal pad 222 and the reference plane 210 is reduced, and thus the characteristic impedance value of the signal pad 222 is increased. Accordingly, the characteristic impedance difference between the signal line 224 and signal pad 222 can be reduced to increase the consistency of characteristic impedance value of the signal transmission path, and hence the quality of signal transmission can be improved.

Figure 6A:
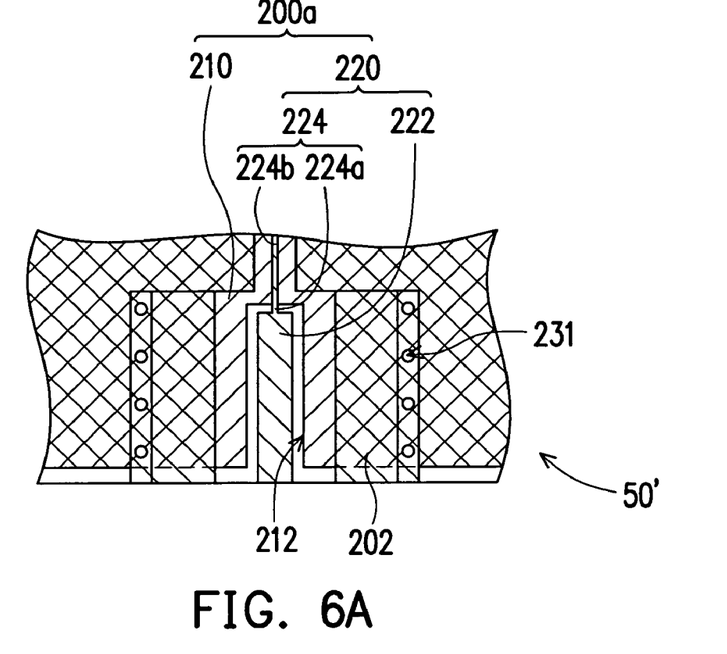
FIG. 6A and FIG. 6B respectively illustrate top views of another two signal transmission structures of the first embodiment of the present invention.
Figure 6B:
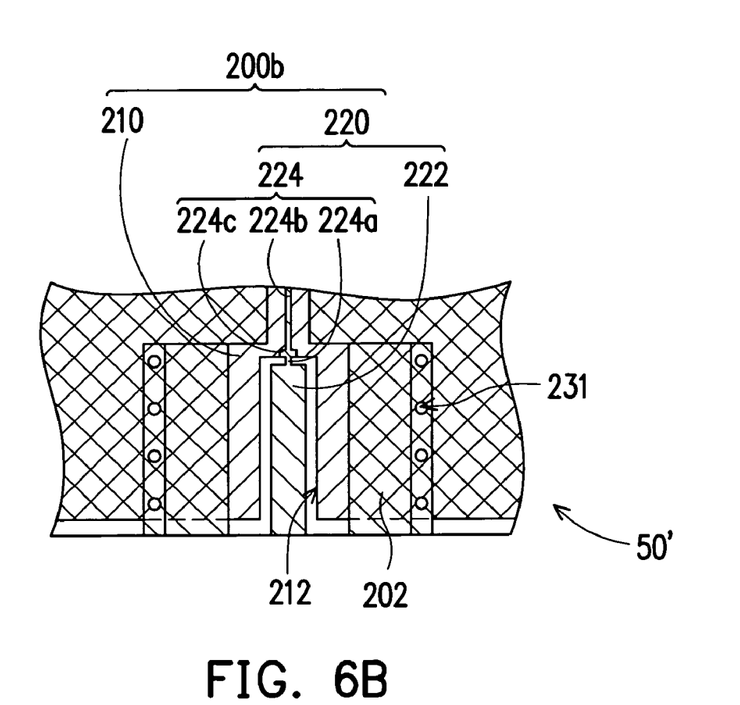

FIG. 6A and FIG. 6B respectively illustrate top views of another two signal transmission structures of the first embodiment of the present invention. Please refer to FIG. 6A, which is similar to FIG. 5A. The difference from FIG. 5A is that, in the signal transmission structure 200a in FIG. 6A, the projection of a portion of signal line 224 on the reference plane 210 is in the first non-conductive area 212. In other words, in the present embodiment in FIG. 6A, the signal line 224 can be considered as two sections, i.e. one is the first line section 224a above the first non-conductive area 212, and the other section is the second line section 224b above the reference plane 210. Since the first line section 224a is located above the first non-conductive area 212, inductance will be generated between the first line section 224a and the reference plane 210, and the inductance can be used to adjust the characteristic impedance value of the signal pad 222. Thus, the consistency of characteristic impedance value of the signal transmission path can be increased, and the quality of signal transmission can be therefore improved.

In another embodiment of the present invention, the size of the first non-conductive area 212 of the reference plane 210 can be changed to adjust the length of the signal line 224 located above the first non-conductive area 212, and the inductance generated between the signal line 224 and the reference plane 210 is consequently changed, so that the characteristic impedance of signal pad 222 is adjusted to a appropriate value to increase the impedance consistency of the signal transmission path.

In the signal transmission structure 200a as shown in FIG. 6A, if the inductance generated between the first line section 224a and reference plane 210 is too large, the impedance consistency of the signal transmission path will be affected. To solve this issue, in a signal transmission structure 200b of the present embodiment as shown in FIG. 6B, a signal line 224 of the signal transmission structure 200b further includes a compensation pad 224c, which is connected between the first line section 224a and the second line section 224b, and the width of the compensation pad 224c is larger than the width of the first line section 224a and that of the second line section 224b. The projection of the compensation pad 224c on the reference plane 210 is adjacent to the edge of the first non-conductive area 212. Since the width of compensation pad 224c (the horizontal width of the compensation pad 224c in FIG. 6B) is larger than the width of the second line section 224b (the horizontal width of the second line section 224b of the compensation pad in FIG. 6B), the capacitance generated between the compensation pad 224c and the reference plane 210 can be used to compensate the large inductance generated between the first line section 224a and the reference plane 210 to improve the impedance consistency of the signal transmission path, and therefore to increase the quality of signal transmission.

Second Embodiment

Figure 7A:
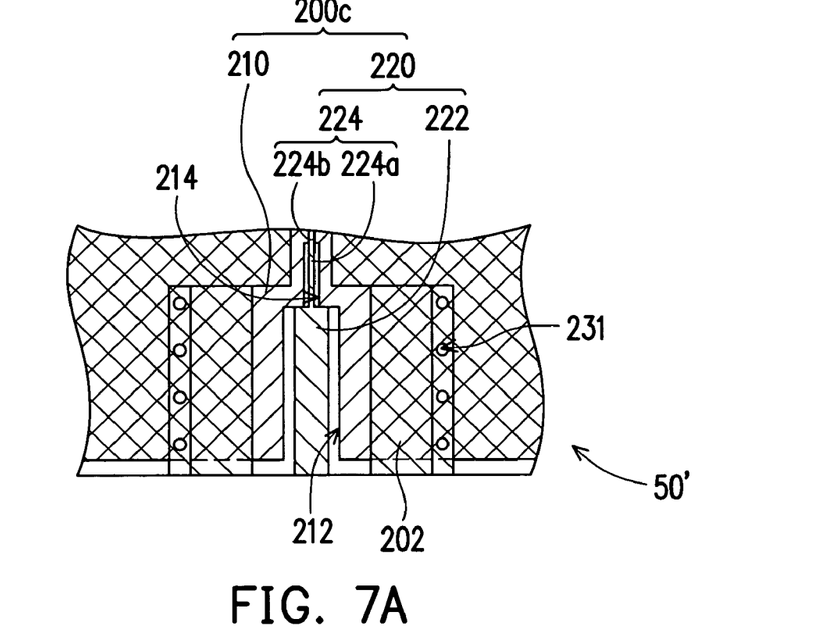
FIG. 7A and FIG. 7B respectively illustrate top views of another two signal transmission structures of the second embodiment of the present invention.
Figure 7B:
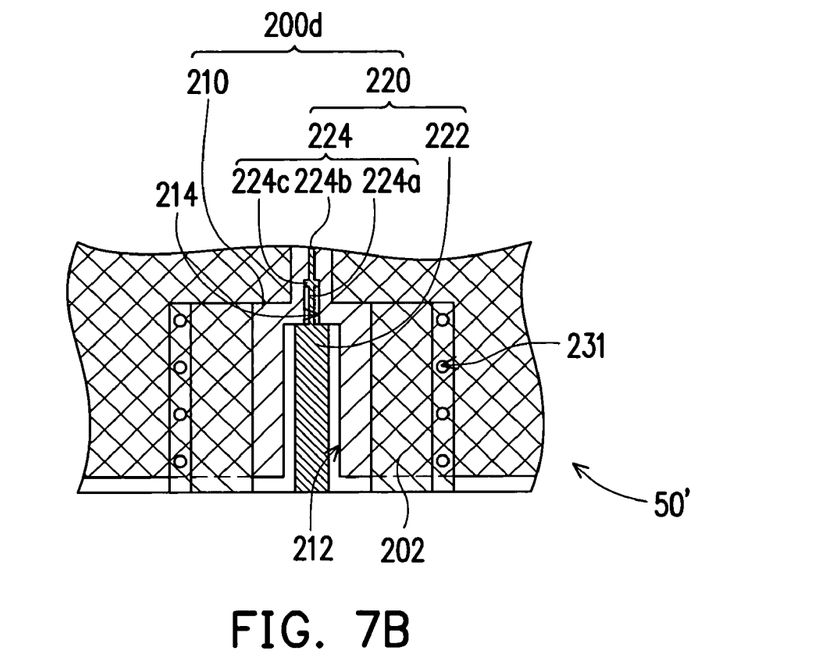

FIG. 7A and FIG. 7B illustrate top views of another two signal transmission structures of the second embodiment of the present invention. With reference to FIG. 7A, a signal transmission structure 200c is similar to the signal transmission structure 200 as shown in FIG. 5A, therefore only the differences between them are described below. In the signal transmission structure 200c, a reference plane 210 not only has a first non-conductive area 212 but also has a second non-conductive area 214, which is adjacent to the first non-conductive area 212. In the present embodiment, the first non-conductive area 212 is connected with the second non-conductive area 214 as shown in FIG. 7A for example, or the first non-conductive area 212 and the second non-conductive area 214 are separated by a portion of the reference plane 210. In addition, the projection of a portion of a signal line 224 on the reference plane 210 is located in the second non-conductive area 214. In other words, in the present embodiment, the signal line 224 can be considered as two sections, i.e. a first line section 224a located above the second non-conductive area 214, and a second line section 224b located above the reference plane 210.

In the signal transmission structure 200c as shown in FIG. 7A, since the projection of the first line section 224a on the reference plane 210 is in the second non-conductive area 214, and there is no other conductive layer below the first line section 224a, there will be inductance generated between the first line section 224a and the reference plane 210 to reduce the capacitance effect of a signal pad 222 of the conductive layer 220, and the impedance consistency of the signal transmission path is increased to improve the signal transmission quality. In addition, in the present embodiment as shown in FIG. 7A, the size of the second non-conductive area 214 of the reference plane 210 can be changed to adjust the length of the signal line 224 located above the second non-conductive area 214, so that the inductance generated between the signal line 224 located above the second non-conductive area 214 and the reference plane 210 is changed, so that the characteristic impedance of the signal pad 222 is adjusted to a appropriate value to improve the impedance consistency of the signal transmission path.

In the signal transmission structure 200c as shown in FIG. 7A, if the inductance generated between the first line section 224a and the reference plane 210 is too large, the impedance consistency of the signal transmission path will be affected. To solve this issue, in the signal transmission structure 200d as shown in FIG. 7B, a signal line 224 further includes a compensation pad 224c which is connected between a first line section 224a and a second line section 224b thereof, and the projection of the compensation pad 224c on a reference plane 210 is in the reference plane 210 and adjacent to the edge of the second non-conductive area 214. Because the width of the compensation pad 224c is larger then that of the first line section 224a or that of the second line section 224b, a greater capacitance between the compensation pad 224c and the reference plane 210 is generated. The capacitance between the compensation pad 224c and the reference plane 210 compensates the large inductance generated between the first line section 224a and the reference plane 210, so as to improve the impedance consistency of the signal transmission path, and thus improve the quality of signal transmission.

To sum up, the signal transmission structure of the present invention has at least the following advantages:

1. Since the reference plane has the first non-conductive area, this first non-conductive area can reduce the capacitance generated between the signal pad and the reference plane to increase the characteristic impedance value of the signal pad, and therefore the impedance consistency of the signal transmission path is improved, and the quality of signal transmission is improved.

2. In one embodiment of the present invention, the impedance consistency of the signal transmission path is adjusted through the inductance generated between the signal line located above the first non-conductive area of the reference plane and the reference plane, to adjust the impedance consistency of the signal transmission path, so that the signal transmission quality is further improved.

3. The second non-conductive area can also be added in the reference plane, so that inductance is generated between the signal line located above the second non-conductive area and the reference plane to reduce the capacitance of the signal pad, so that the impedance consistency of the signal transmission path is improved, and therefore the signal transmission quality is further improved.

4. Through the capacitance generated between the compensation pad and the reference plane, the large inductance generated between the signal line located above the first non-conductive area or the large inductance generated between the second non-conductive area and the reference plane can be compensated, so as to improve the impedance consistency of the signal transmission path, and thus improve the signal transmission quality.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A signal transmission structure suitable for a circuit board, the signal transmission structure being located at the edge of the circuit board, the circuit board being connected to a coaxial connector through the signal transmission structure, the coaxial connector has a signal pin and a plurality of supporting pins, and the supporting pins are suitable for the mechanical connections with the circuit board, the signal transmission structure comprising:

a reference plane, located inside the circuit board, and having a first non-conductive area and a second non-conductive area adjacent to the first non-conductive area;

a conductive layer, located above one side of the reference plane, and on the surface of the circuit board, the conductive layer comprising:

a signal pad, suitable to connect the signal pin, and the projection of the signal pad on the reference plane being located in the first non-conductive area, and a signal line, connected to the signal pad, the projection of a portion of the signal line on the reference plane being located in the first non-conductive area and the second non-conductive area, and the signal line comprises:

a first line section, connected to the signal pad, and the projection of the first line section on the reference plane being located in the second non-conductive area;

a second line section; and a compensation pad, connected between the first line section and the second line section, wherein the compensation pad has a width larger than a width of the first line section.

2. The signal transmission structure of claim 1, wherein the conductive layer further comprising a plurality of supporting pads disposed between the supporting pins and the circuit board respectively and electrically connected to the reference plane.

3. The signal transmission structure of claim 1, wherein the reference plane is a ground plane or a power plane.

4. The signal transmission structure of claim 1, wherein the projection of the first line section on the reference plane is in the first non-conductive area.

5. The signal transmission structure of claim 4, wherein the projection of the compensation pad on the reference plane is adjacent to an edge of the first non-conductive area.

6. A circuit board, suitable for connecting to a coaxial connector through an edge of the circuit board, the coaxial connector having a signal pin and a plurality of supporting pins, and the supporting pins are suitable for the mechanical connections with the circuit board, the circuit board comprising:

a reference plane, having a first non-conductive area and a second non-conductive area adjacent to the first non-conductive area;

a conductive layer, located above one side of the reference plane, wherein the conductive layer comprises:

a signal pad, suitable to connect the signal pin, and the projection of the signal pad on the reference plane being located in the first non-conductive area;

a signal line, connected to the signal pad, and the projection of a portion of the signal line on the reference plane being located in the first non-conductive area and the second non-conductive area, and the signal line comprises:

a first line section, connected to the signal pad, and the projection of the first line section on the reference plane being located in the second non-conductive area;

a second line section; and a compensation pad, connected between the first line section and the second line section, wherein the compensation pad has a width larger than a width of the first line section; and a dielectric layer, disposed between the reference plane and the conductive layer.

7. The circuit board of claim 6, wherein the reference plane is a ground plane or a power plane.

8. The circuit board of claim 6, further comprising a plurality of supporting pads disposed between the supporting pins and the circuit board respectively, and the supporting pads are electrically connected to the reference plane.

9. The circuit board of claim 6, wherein the projection of the first line section on the reference plane is in the first non-conductive area.

10. The circuit board of claim 9, wherein the projection of the compensation pad on the reference plane is adjacent to an edge of the first non-conductive area.

11. A connector assembly structure, comprising:

a circuit board, comprising:

a reference plane, having a first non-conductive area and a second non-conductive area adjacent to the first non-conductive area;

a conductive layer, disposed above one side of the reference plane, wherein the conductive layer comprises:

a signal pad, the projection of the signal pad on the reference plane being located in the first non-conductive area; and a signal line, connected to the signal pad, the projection of a portion of the signal line on the reference plane being in the first non-conductive area and the second non-conductive area, and the signal line comprises:

a first line section, connected to the signal pad, and the projection of the first line section on the reference plane being located in the second non-conductive area;

a second line section; and a compensation pad, connected between the first line section and the second line section, wherein the compensation pad has a width larger than a width of the first line section;

a dielectric layer, disposed between the reference plane and the conductive layer; and a coaxial connector, having a signal pin and a plurality of supporting pins, wherein the supporting pins are suitable for clipping the circuit board, and the signal pin is suitable for connecting with the signal pad.

12. The connector assembly structure of claim 11, wherein the reference plane is a ground plane or a power plane.

13. The connector assembly structure of claim 11, wherein the projection of the first line section on the reference plane is in the first non-conductive area.

14. The connector assembly structure of claim 13, further comprising a plurality of supporting pads disposed between the supporting pins and the circuit board respectively and the supporting pads are electrically connected to the reference plane.

* * * * *